US008723269B2

(12) United States Patent
Rockett

(10) Patent No.: US 8,723,269 B2
(45) Date of Patent: May 13, 2014

(54) BURIED POWER GRID DESIGNS FOR IMPROVED RADIATION HARDNESS IN CMOS TECHNOLOGIES

(71) Applicant: Leonard Richard Rockett, Washington, DC (US)

(72) Inventor: Leonard Richard Rockett, Washington, DC (US)

(*) Notice: Subject to any disclaimer, the term of this patent is extended or adjusted under 35 U.S.C. 154(b) by 0 days.

(21) Appl. No.: 13/726,975

(22) Filed: Dec. 26, 2012

(65) Prior Publication Data

US 2013/0161758 A1     Jun. 27, 2013

Related U.S. Application Data

(60) Provisional application No. 61/580,399, filed on Dec. 27, 2011.

(51) Int. Cl.
  *H01L 27/092* (2006.01)
(52) U.S. Cl.
  USPC .......................................................... 257/369
(58) Field of Classification Search
  USPC .......................................... 257/369; 438/199
  See application file for complete search history.

(56) References Cited

U.S. PATENT DOCUMENTS

| 4,430,792 | A | * | 2/1984 | Temple | 438/138 |
|---|---|---|---|---|---|
| 4,506,436 | A | | 3/1985 | Bakeman | |
| 5,072,133 | A | | 12/1991 | Zoutendyk | |
| 5,821,145 | A | | 10/1998 | Goo | |
| 6,653,708 | B2 | | 11/2003 | Doyle | |
| 7,304,354 | B2 | | 12/2007 | Morris | |
| 7,629,654 | B2 | * | 12/2009 | Morris | 257/372 |
| 7,804,138 | B2 | * | 9/2010 | Morris | 257/372 |
| 8,093,145 | B2 | | 1/2012 | Morris | |
| 8,252,642 | B2 | | 8/2012 | Morris | |
| 8,278,719 | B2 | | 10/2012 | Morris | |

OTHER PUBLICATIONS

Rockett, Radiation Hardened CMOS Technologies using Buried Power Grids, EE Times Technical Papers, www.techonline.com/4238418, US, Mar. 20, 2012.
Pellish et. al., Substrate Engineering Concepts to Mitigate Charge Collection in Deep Trench Isolation Technologies, IEEE Trans. Nucl. Sci., vol-53 (6) (2006) pp. 3298-3305, US, Dec. 2006.
Saxena, Process technique for SEU reliability improvement of deep sub-micron SRAM cell, Solid State Electronics, 47 (2003) pp. 661-664, GB, Jan. 2003.

(Continued)

*Primary Examiner* — Thao P Le
(74) *Attorney, Agent, or Firm* — Leonard Richard Rockett

(57) ABSTRACT

Buried power grids are designed as a fine mesh-type pattern of heavily doped diffusion regions with neutral epitaxial region cores to allow the uninterrupted electrical continuity of the epitaxial substrate, thus avoiding floating substrate effects. The buried power grids are formed beneath the epitaxial substrate surface and are powered via electrical contact to adjacent well regions. The buried power grids, when powered, form strongly reverse-biased buried pn junction regions that restrict radiation induced excess charge collection volumes and draw excess charge away from sensitive circuit nodes The method for forming buried power grids requires no uniquely complex process steps and no critical mask alignments to the CMOS devices on the epitaxial top surface. Buried power grids provide enhanced protection to sensitive circuit nodes against logic upsets due to single-particle and prompt dose radiation events and thereby improve the radiation hardness and decreases the latchup susceptibility of CMOS circuits.

7 Claims, 12 Drawing Sheets

NOT DRAWN TO SCALE

(56) References Cited

OTHER PUBLICATIONS

Wordeman et. al., A buried N-grid for protection against radiation induced charge collection in electronic circuits, IEEE International Electron Devices Meeting Digest 27 (1981) pp. 40-43, US, Dec. 1981.

Baliga, A novel buried grid device fabrication technology, IEEE Electron Device Letters, EDL-1 (12) (1980) pp. 250-252, US, Dec. 1980.

* cited by examiner

NOT DRAWN TO SCALE

BURIED POWER GRID DESIGNS FOR IMPROVED RADIATION HARDNESS IN CMOS TECHNOLOGIES

CROSS REFERENCE TO PROVISIONAL PATENT APPLICATION

This application claims the benefit of the filing date of Provisional Patent Application No. U.S. 61/580,399 filed Dec. 27, 2011, entitled "Buried Power Grid Designs and the Methods for Forming Buried Power Grids in CMOS Technologies for Improved Radiation Hardness" and naming Leonard R. Rockett as the inventor.

TECHNICAL FIELD

Radiation induced logic upsets and upset-causing phenomena (e.g., single-event upsets, single-event transients, single-event functional interrupts, prompt dose upsets, and prompt dose transients) are concerns for microelectronics used in aerospace and defense applications. As advanced microelectronic technologies are further downscaled in an effort to extract more performance and density, and their corresponding voltages and signal charge levels are likewise downscaled, the threat of single particle events and prompt dose events causing logic upsets increases. Single event effects are even becoming a problem for advanced microelectronics used in commercial applications due to terrestrial sources of high energy particles. Currently practiced design and process hardening techniques alone are inadequate for preventing logic upsets in scaled technologies. New approaches are needed.

Novel buried power grids that derive their power from a pre-existing feature of CMOS technologies ensure all charge funnels formed along the ion track following an ion strike are intercepted and partially neutralized, and they also significantly restrict the collection volume of excess charge following a high dose rate event; thereby enhancing radiation hardness. Additionally, the unique design of the buried power grid maintains the electrical continuity of the epitaxial/substrate with its contiguous back plane, eliminating the need for any extra top surface contact regions to the epitaxial/substrate to prevent substrate bounce effects. This present invention describes the novel buried power grid design and the method for forming buried power grids in CMOS technologies for improved radiation hardness.

BACKGROUND OF THE INVENTION

Space and military systems used in strategic applications are often built using radiation hardened microelectronics. Radiation hardened microelectronics are ruggedized to withstand the deleterious effects of ionizing radiation exposure. Radiation hardened technologies use a combination of design and process techniques and potentially new materials to harden microelectronics. Complementary Metal Oxide Semiconductor (CMOS) integrated circuits (ICs) have been and continue to be the largest category of microelectronics. Radiation hardened CMOS microelectronics are essential in space and military system applications where the certainty of radiation exposure must not be allowed to threaten the mission.

The natural and man-made radiation spectrum includes highly-energetic charged particles accelerating along uncorrelated trajectories from a variety of sources as well as high-energy mega-bursts of particles and photons. When energetic charged particles or photons interact with microelectronics some of their energy is absorbed by the electronics creating electron-hole pairs (free excess charge) within the constituent semiconductor materials of the electronics. This radiation-induced excess charge when collected within sensitive regions of microcircuits can destroy stored information and in extreme events can permanently damage the electronics (e.g., burnout). Specific design and process hardening techniques are commonly used to mitigate the effects of radiation on microelectronics to prevent logic upsets, but these techniques are becoming increasing less effective in scaled technologies. New hardening approaches are required. This present invention presents a new approach that if necessary can be easily used in concert with the currently practiced techniques to more effectively harden digital CMOS technologies against single-event charged particle-induced logic upsets and prompt-dose (i.e., high ionizing dose rate) induced logic upsets.

Full static CMOS logic design involves the pairing of N-channel Field Effect Transistors (NFETs) with complementary P-channel Field Effect Transistors (PFETs). CMOS logic is characterized by its low quiescent power dissipation. Steady state CMOS digital logic gates invariably involve one transistor type being "ON" while the complementary transistor type is "OFF," so there is never a sustained direct current path coupling the power rails (i.e., VDD and GND). The simple schematic for a CMOS inverter circuit is shown in FIG. 1.

The NFET and PFET of the CMOS inverter share a common gate (G) node, gated by input voltage VIN, and their drain (D) nodes are connected together to provide the output voltage VOUT. The NFET source (S) and substrate (Sx) nodes are connected to ground (GND) while the PFET source (S) and substrate (Sx) nodes are connected to the supply voltage (VDD). When VIN is HIGH (i.e., VIN=VDD) the NFET is "ON" and the PFET is "OFF" and thus VOUT is LOW (i.e., VOUT=GND). When VIN is LOW (i.e., VIN=GND) the NFET is "OFF" and the PFET is "ON" and thus VOUT is HIGH (i.e., VOUT=VDD).

A simplified physical cross-section of a CMOS inverter is shown in FIG. 2. (Though lacking some of the physical detail of CMOS technology (e.g., shallow trench isolation, drain/source region diffusion extensions, multi-level metal interconnects), this simple cross-section is adequate for the discussions that follow).

The cross-section of an N-well, P-epitaxial/bulk CMOS technology is illustrated here and will be used to describe the features of this buried power grids though the concepts to be described herein can be applied equally to any CMOS construction. The NFET is built into the p epi overlying the starting p+ substrate and a shallow, retrograde n-well is formed within the p epi to accommodate the PFET. Metal connections are used to configure the inverter circuit. (The full interconnect detail cannot be shown in this simple two-dimensional illustration).

In the event that a highly-energetic charged particle (i.e., ion) strikes a microcircuit, excess electron-hole pairs are generated in a dense plasma along the track of the particle through the semiconductor. If the ion strike occurs on or near a circuit node, this excess charge can be collected at the sensitive regions of the circuit node and result in a logic upset-causing voltage spike. The most efficient charge collection regions in microelectronics are strongly reverse-biased pn junction diffusion regions. Logic upsets in CMOS microelectronics are primarily due to excess charge collection at the strongly reverse-biased transistor drain diffusions at each circuit node. Again, considering the CMOS inverter, when VOUT is HIGH the sensitive region is the strongly reverse-biased drain region of the "OFF" NFET. An ion strike in this circumstance to the NFET drain will cause free excess electrons to be collected by the NFET drain region, momentarily driving down the potential at VOUT. This resulting voltage spike can be wrongly interpreted by surrounding circuitry as valid logic data and the incorrect information can be propagated and potentially stored. Similarly, when VOUT is LOW the sensitive region is the strongly reverse-biased drain region of the "OFF" PFET. Now, an ion strike in this circumstance to the PFET drain will cause free excess holes to be collected by the PFET drain region, momentarily driving up the potential at VOUT. This resulting voltage spike can be wrongly interpreted by surrounding circuitry as valid logic data and the incorrect information can be propagated and potentially stored. Similarly in the event of a prompt dose pulse of ionizing radiation the resulting clouds of excess charge generated throughout the semiconductor volume is most effectively collected by strongly reverse-biased regions of the circuit. As microelectronics technologies are increasingly downscaled to extract more performance and density from circuits, their power supply voltages and signal charge levels are similarly downscaled causing a higher susceptibility of the circuit to single event and prompt dose induced logic upsets.

As described previously, when VOUT is HIGH, an ion strike to the "OFF" NFET drain will result in the collection of the excess electrons generated along the track within the p epitaxial layer. (The associated excess holes along the ion track are injected into the p epi/substrate tied to GND). The excess carriers generated beyond the epi layer within the more heavily doped p+ substrate generally quickly recombine and are not collected at the NFET drain, so in this sense the p+ substrate effectively truncates the effect of the ion track so that only the excess electrons along the track within the epi layer are collected by the NFET drain. This is illustrated in FIG. 3. (Note: The depletion regions associated with reverse-biased pn junction regions are not explicitly shown in these illustrations).

In advanced radiation hardened microelectronics, concerted efforts are made to make the epi layer as thin as possible in order to limit the amount of charge that can be collected by a sensitive region due to a single particle event. However, since the epi layer must be thick enough to accommodate the well and diffusions of the complementary transistor type (i.e., the n-well and PFET in FIG. 3), there are limits on how thin one can make the epi layer.

Again, as described previously, when VOUT is LOW, an ion strike to the "OFF" PFET drain will result in the collection of the excess holes generated along the track within the shallow n well. (The associated excess electrons along the ion track are injected into the n well tied to VDD). The excess carriers generated in the p epi/bulk regions below the well are not collected at the PFET drain, so in this sense the reverse-biased n-well/p-epi junction not only truncates the effect of the ion track but also, due to the electrical field at this reverse-biased well/epi junction, draws some of the excess holes generated in the well away from the drain region of PFET so that only a fraction of the excess holes along the track within the shallow n well is collected by the PFET drain, providing enhanced protection against logic upsets. This is illustrated in FIG. 4.

This enhanced protection offered by the well/epi junction to the devices residing in the shallow well has been validated by the results of radiation testing CMOS hardware that correlate to response models that show that the devices lying outside of the well are the most prone to radiation-induced upsets because of their associated longer ion tracks and larger excess charge collection volumes.

Similarly, when VOUT is LOW, the reverse-biased well/epi junction provides enhanced protection against logic upsets to the "OFF" PFET drain regions in the shallow n well in a high-dose rate, prompt dose radiation (e.g., weapons) environment when the energy absorbed from the radiation is converted into pervasive free excess electron-hole pair clouds throughout the entire semiconductor, as depicted in FIG. 5. (Note: Only the excess electron-hole pairs generated within the epi layer and well region are shown in these illustrations since the electron-hole pairs generated deep within the underlying heavily doped p+ substrate quickly recombine at the cessation of the radiation pulse, so they do not affect the devices built of the top surface of the semiconductor).

Again, in this case, the excess carriers generated in the epi/bulk regions below the well are not collected at the PFET drain, so in this sense the reverse-biased n-well/p-epi junction not only restricts the collection volume for excess holes to the shallow well region around the drain but also, due to the electrical field at this reverse-biased well/epi junction, draws some of the excess holes generated in the well region around the drain away from the drain of PFET so that only a fraction of the excess holes within the shallow well region around the drain is collected by the PFET drain, again providing enhanced protection against logic upsets.

When VOUT is HIGH, the heavily doped p+ substrate restricts the collection volume for prompt dose induced excess electrons by the NFET drain to only the p epi region around the NFET drain since the excess carriers generated within the heavily doped substrate would recombine before diffusing to the drain. The absence of a nearby competing charge collecting reverse-biased pn junction like that offered by the well/epi junction for the PFET drains prevents enhanced protection against prompt dose upsets for NFET devices outside of the shallow well. This is illustrated in FIG. 6.

Radiation induced logic upsets and upset causing phenomena (e.g., single-event upsets, single-event transients, single-event functional interrupts, prompt dose upsets, and prompt dose transients) are becoming a much larger problem as technologies are downscaled. Currently practiced design and process hardening techniques alone are inadequate for preventing upsets in scaled technologies. New approaches are needed. The preceding discussion has shown that by virtue of the existence of a reverse-biased well/epi pn junction a CMOS circuit is far less susceptible to the impact of logic upset causing radiation-induced phenomena at the sensitive regions within the shallow well compared to the sensitive regions that lie outside of the shallow well. The reverse-biased well/epi pn junction provides an enhanced level of protection to the devices built within the shallow well. By extension, an improved level of CMOS radiation hardness can be achieved from a novel approach that uses buried power grids. Buried power grids, as will be shown in the next section, extend this concept of enhanced protection also to the devices built outside of the shallow well, thereby improving the overall radiation hardness of CMOS circuits.

SUMMARY OF THE INVENTION

In the view of the above, the objects of this present invention, among others, are to provide novel buried power grid design and the methods for forming buried power grids in CMOS technologies for increased radiation hardness and reduced latchup susceptibility of CMOS circuits.

In view of these objects, the buried power grid design consists of a fine mesh-type pattern of heavily doped diffusion regions that when "buried" in the epitaxial substrate has neutral epi region cores that allow the uninterrupted electrical continuity of epi/substrate, thus avoiding floating substrate effects. The grids are powered via electrical connections to adjacent wells, so the buried power grids are designed and positioned to ensure these electrical connections to adjacent well regions. The buried power grid fine mesh design, when powered, forms strongly reverse-biased buried pn junction regions that restrict excess charge collection volumes and draw excess charge away from the sensitive circuit nodes thereby guaranteeing enhanced protection against radiation-induced logic upsets for CMOS circuits, independent of irradiating species, angle of incidence, and particle energy.

Further, the methods for forming buried power grids are straight forward and easily implementable, requiring no uniquely complex process steps and no critical mask alignments to the devices on the top surface. The buried power grids are buried beneath the top surface such that the grids in no way interfere with the electrical properties of the transistors to be formed on the epi surface. The buried power grid depth is targeted to be no deeper than the adjacent well regions to ensure contact with adjacent wells for electrical connection to power, thus no deep contacts regions to the buried grids are needed to apply power to the grids. Forming the buried power grids places no restrictive or special requirements on the succeeding process steps in building out the CMOS circuits.

Buried power grids provide enhanced protection to sensitive circuit nodes against logic upsets due to single-particle and prompt dose radiation events and thereby improves the radiation hardness and decreases the latchup susceptibility of the overall CMOS circuit, independent of the CMOS circuit design. Buried power grids can be effectively implemented in all CMOS technologies, including single well and dual well constructions.

DESCRIPTION OF THE PREFERRED EMBODIMENT

The radiation hardening technique described herein places a buried power grid within the epi layer to now provide enhanced protection against logic upsets and upset-causing events to the devices that lie outside of the shallow well.

Grid Design

Figure 1:
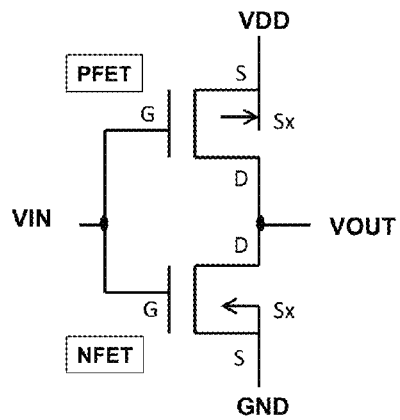
FIG. 1. Schematic of static CMOS inverter circuit.
Figure 2:
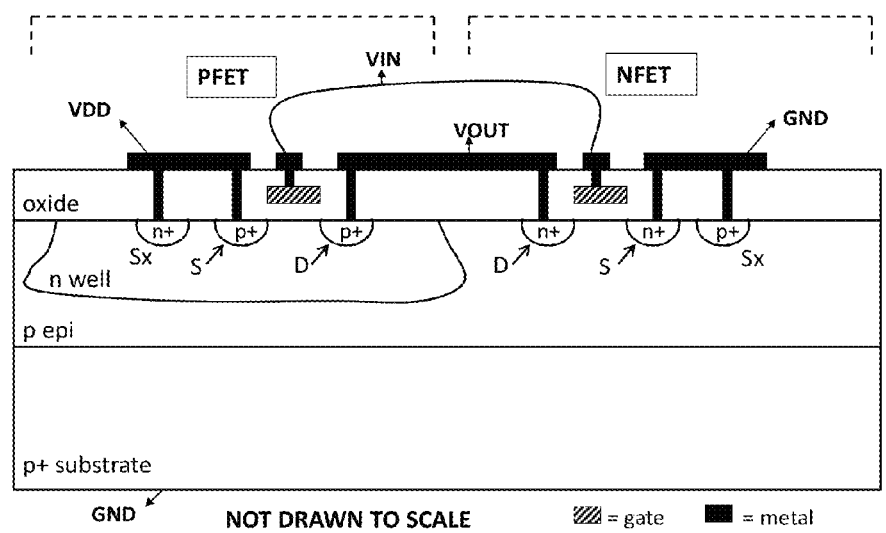
FIG. 2. Simplified depiction of the physical cross-section of a CMOS integrated circuit.
Figure 3:
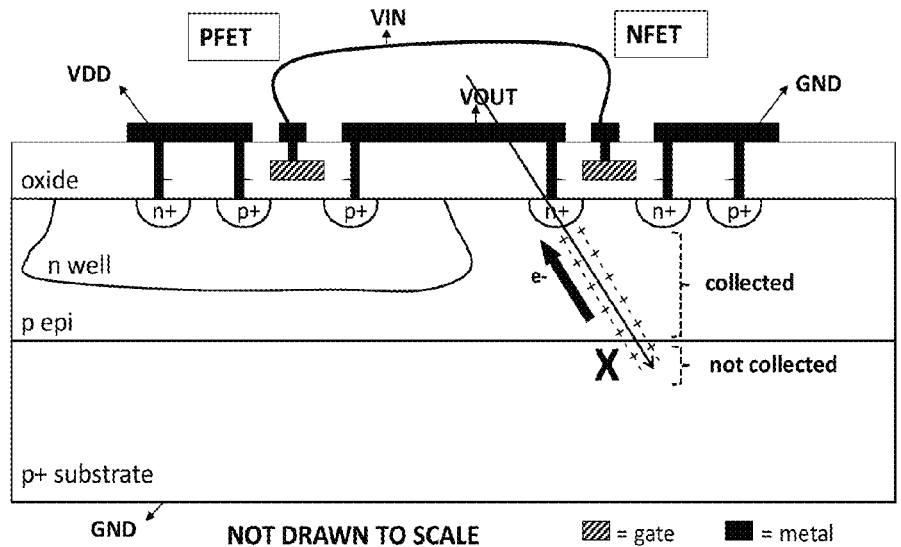
FIG. 3. Illustration of an ion strike to the "OFF" NFET drain region and the resulting excess charge along the ion track. Only the excess electrons within the p epi layer are collected at the drain region.
Figure 4:
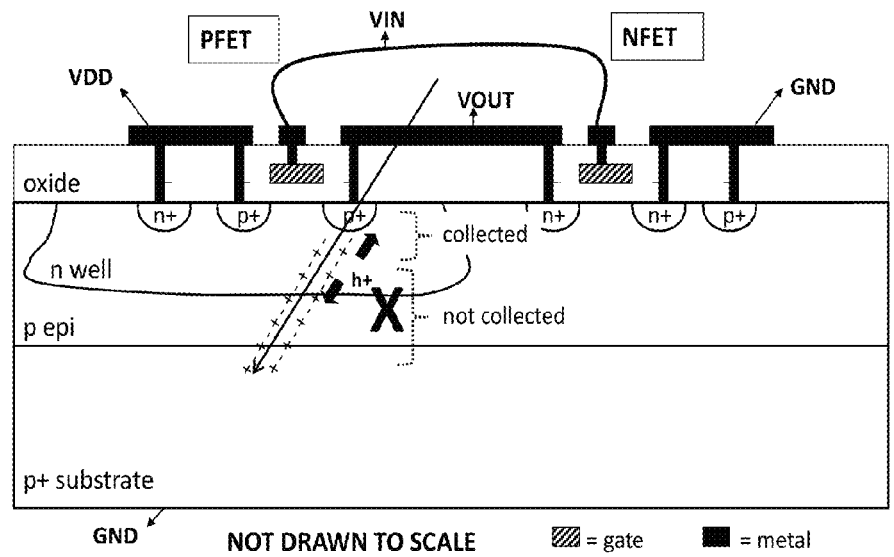
FIG. 4. Illustration of an ion strike to the "OFF" PFET drain region and the resulting excess charge along the ion track. Only a fraction of the excess electrons within the shallow n well is collected at the drain region.
Figure 5:
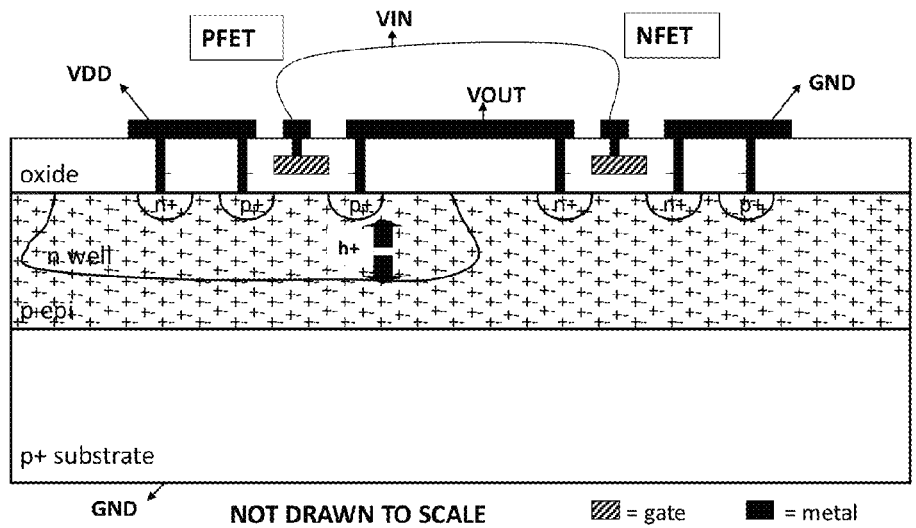
FIG. 5. Illustration of the excess charge generated within the semiconductor due to a prompt dose radiation pulse. Only a fraction of the excess electrons within the shallow n well is collected at PFET drain regions.
Figure 6:
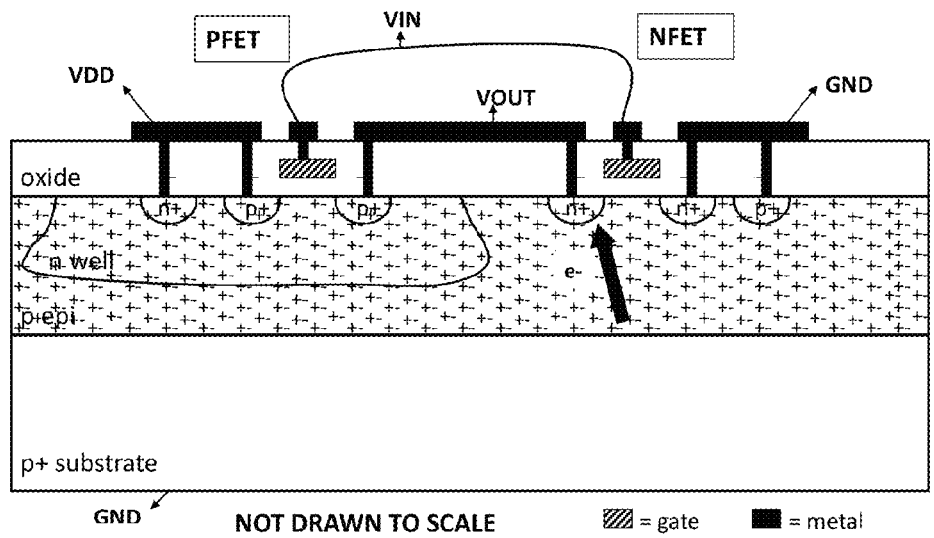
FIG. 6. Illustration of the excess charge generated within the semiconductor due to a prompt dose radiation pulse. Excess holes within the p epi layer are collected at NFET drain regions.
Figure 7:
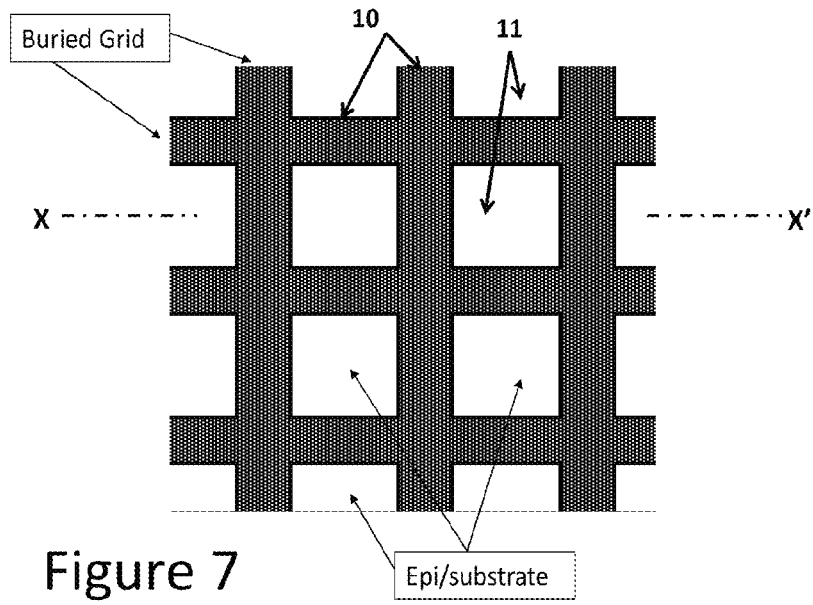
FIG. 7. Top view of buried power grid design.

The buried power grid is an extensive heavily-doped mesh-structured diffusion region buried below the top surface of the final epi layer, of conductivity type opposite of that of the epi layer so that a buried pn junction is formed at the grid/epi interface. Therefore, a heavily-doped n-type grid is formed in a p-type epitaxial layer. (Conversely, a heavily-doped p-type grid would similarly be formed in an n-type epitaxial layer, though this specific construction is not discussed here in detail). A top view of the grid is illustrated in FIG. 7.

The shaded regions (10) are the intersecting diffusion region gridlines. The clear regions (11) between the gridlines are the unaltered regions of the epi substrate. This grid design is uniform throughout the grid.

Figure 8:
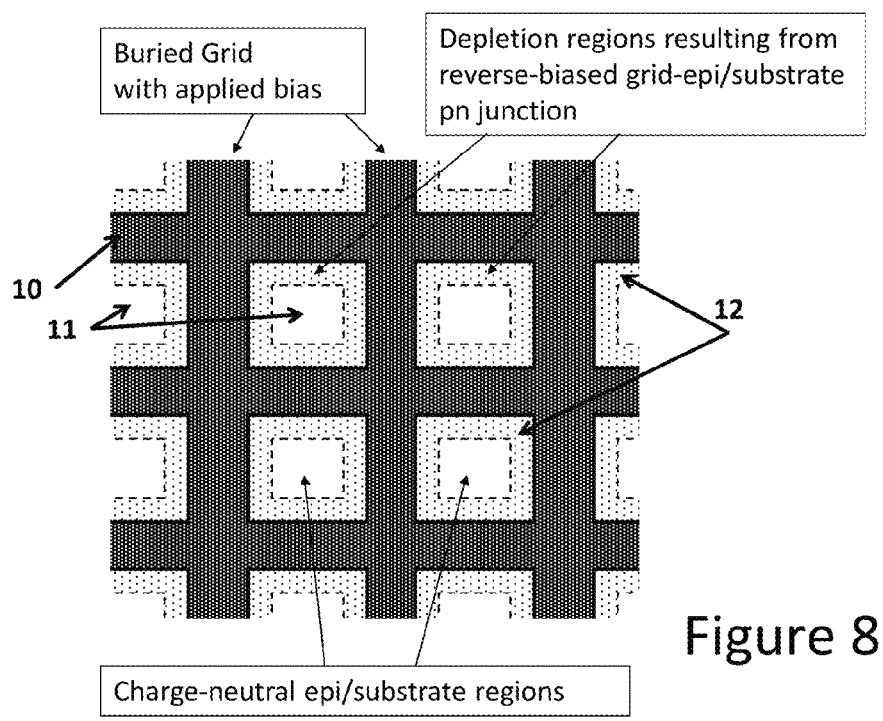
FIG. 8. Top view of buried power grid with applied bias and now explicitly illustrating the reverse-bias depletion regions that extend primarily into the epi.

When VDD is applied to the n grid buried within the grounded p epi layer, a strongly reverse-biased depletion region forms along the grid/epi pn junction interface. The n doping concentration in the grid is made significantly higher than that of the p epi layer, thus this depletion region (12) extends principally into the epi layer as illustrated in the top view shown in FIG. 8.

The charge-neutral epi/substrate regions bounded by the depletion regions between the powered gridlines are essential in the grid design for maintaining the electrical continuity of the grounded epi substrate on all sides of the grid and throughout the contiguous epi/substrate, eliminating the need for any extra top surface deep "plug" contact regions to the epi/substrate to prevent the substrate potential bounce effects that are characteristic of floating substrate regions. This is a very important, unique feature of this buried power grid design not found in any other buried layer concept.

Advances in integrated circuit (IC) lithography now allow this novel buried grid concept to be designed like a very fine mesh such that the "fabric" is woven tightly enough to ensure that the grid provides enhanced protection against upsets independent of the energy, angle of incidence, or species of any and all irradiating particles, while still allowing for the uninterrupted electrical continuity of the epi/substrate by ensuring interwoven charge-neutral epi regions. Additionally, since the grid is buried, the grid has no adverse impact on the CMOS circuits integrated on the surface of the epi layer.

Figure 9:
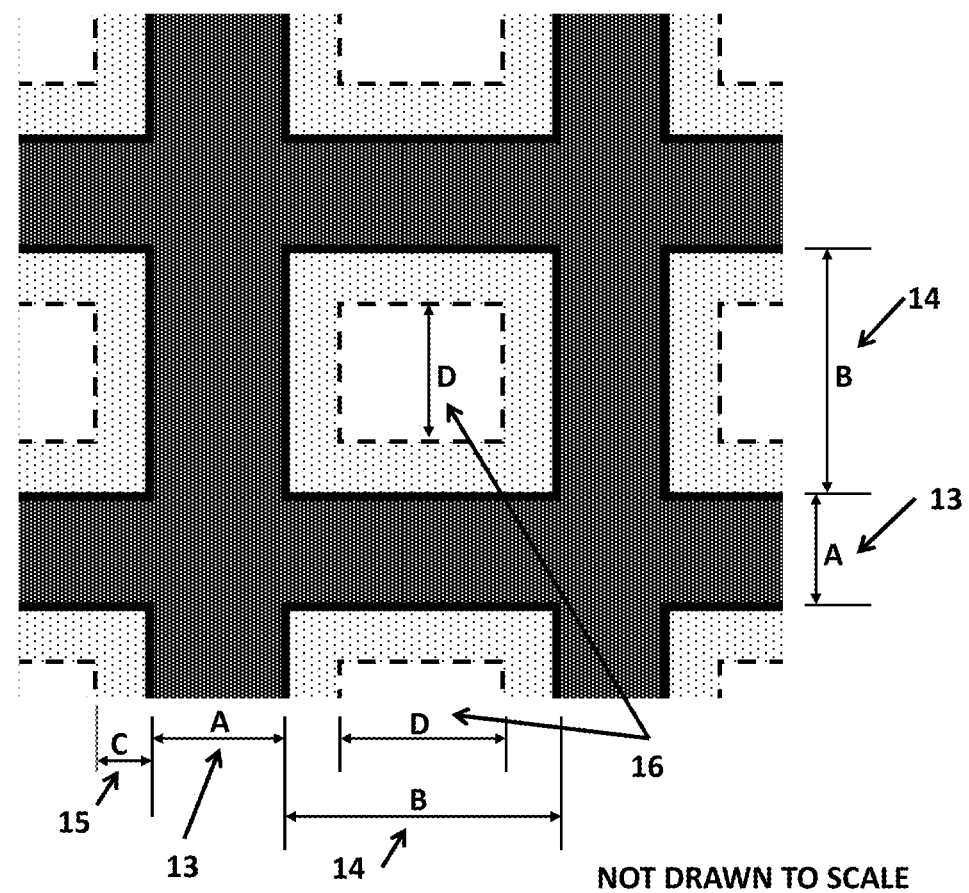
FIG. 9. Magnified top view of a section of the grid, with labeled grid dimensions.

Consider a magnified top view illustration of a section of the grid, with grid dimensions labeled as shown in FIG. 9.

Particle physics experimental evidence has shown that the highly concentrated free carrier plasma that forms within fractions of picoseconds ($10^{-12}$ sec) along an ion track following an ion strike has an initial radius of approximately 100 nm which expands radially with time due to ambipolar diffusion. (Charge collection by a struck circuit node extends over fractions of nanoseconds ($10^{-9}$ sec)). Using this as a guideline, to best ensure that the buried power grid consistently provides enhanced protection against radiation-induced upsets, dimension D (16) for the charge-neutral epi regions should be designed to be no greater than the diameter of the initial ion track plasma for a particle striking at normal incidence to the surface of the IC (i.e., 200 nm) but large enough to reliably ensure the electrical continuity of the epi/substrate (≥50 nm). This is easily achievable.

Keeping dimension A (13) as small as possible (≤500 nm) further ensures better overall ground distribution within the epi/substrate. In practice, process modeling and validating physical analysis can used to determine the final gridline width (dimension A (13)) for a given full process flow. With the doping concentration levels for the biased buried power grid and the grounded epi known, the extent of the depletion region into the epi (dimension C (15)) can be determined for a known applied VDD level. Thereby the gridline image and spacing design rules (dimensions A (13) and B (14)) that ensure 50 nm≤D (16)≤200 nm can be established for each specific CMOS process technology.

Method of Forming Buried Power Grid and Applying Power

Figure 10:
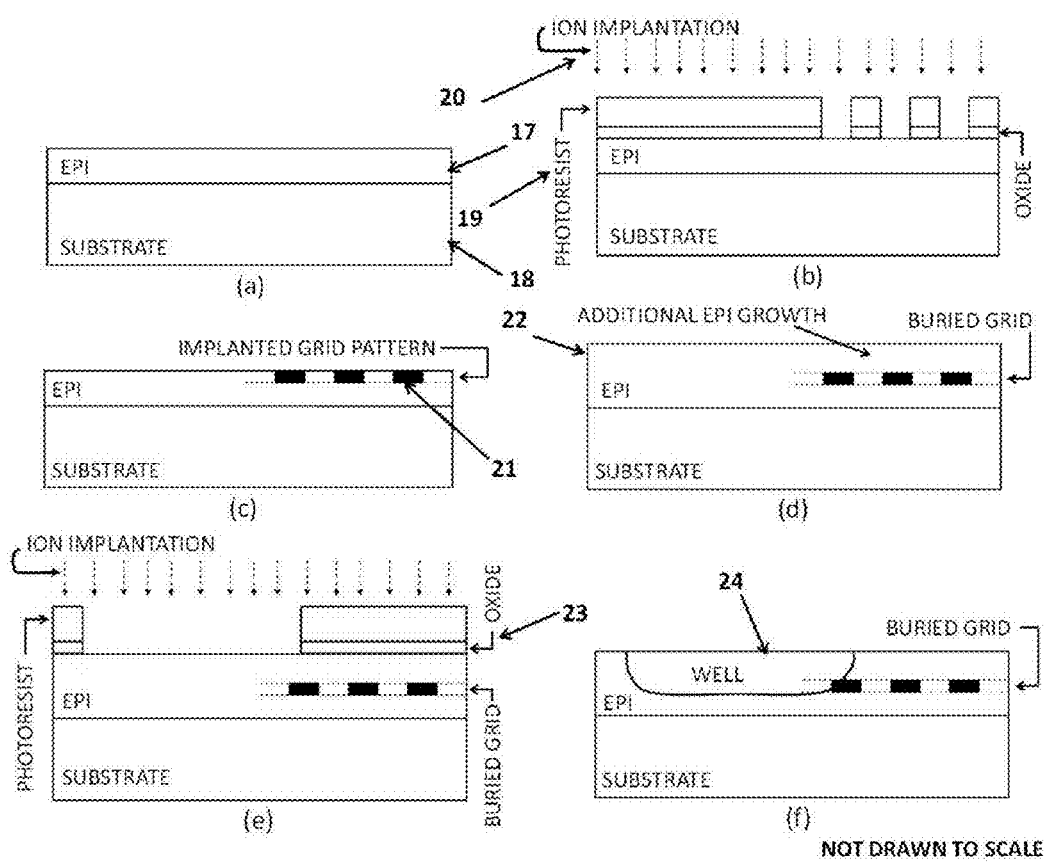
FIG. 10. Method for forming buried power grid in single well type CMOS technologies.

The method of forming the buried power grid is illustrated in FIG. 10, where the specific process steps that directly relate to the forming of the buried power grid are depicted. From the outset it is important to point out that the buried power grid that is formed in the epi layer derives its power from adjacent wells, as will be shown. These process steps depicted in FIG. 10 will be described from a cross-sectional viewing perspective of the final grid structure, as if viewed along the X-X' cut-line shown in FIG. 7.

Figure 11:
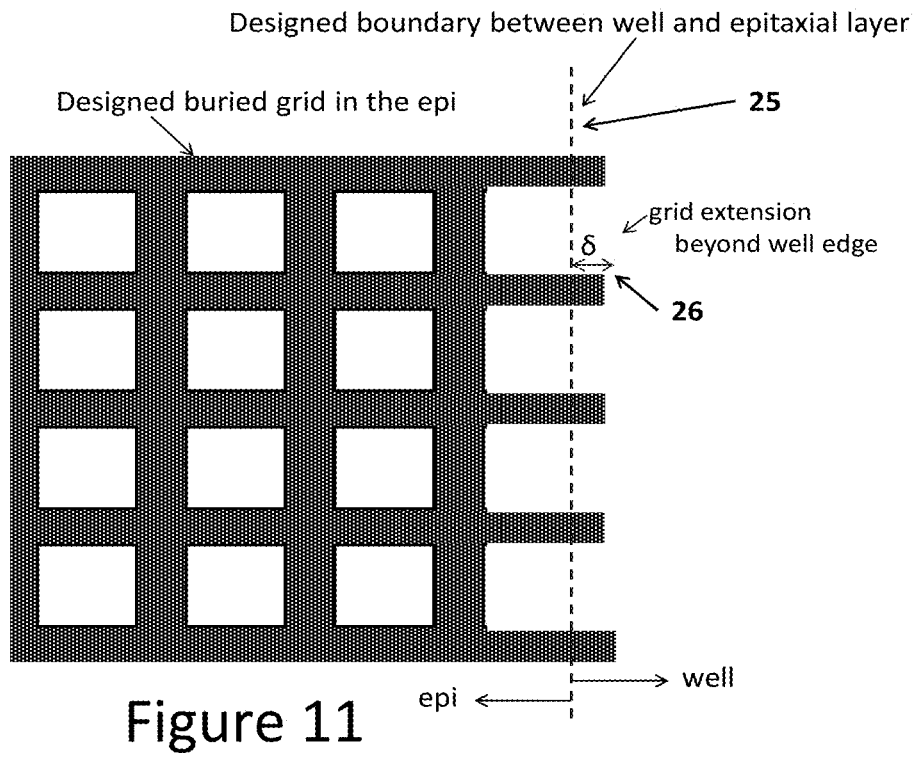
FIG. 11. Buried power grid design at well boundary to ensure sourcing power from well to grid FIG. 12. Physical cross section of CMOS inverter with reverse-biased n+ buried power grid in p epi layer FIG. 13. Illustration of ion strike within well for CMOS with buried power grid.
Figure 12:
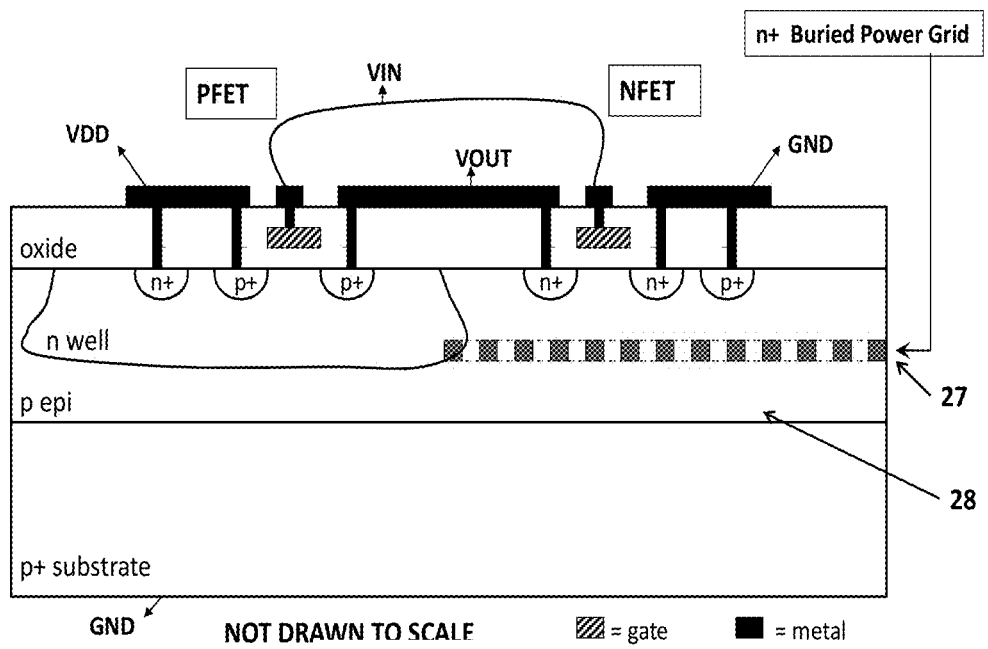

The method to form the buried power grid starts with (a.) forming a thin epitaxial layer (17) on a heavily doped substrate (18). The epi and the underlying substrate are of the same conductivity type (e.g., p-type). Then (b.) a photolithographic masking step (19), using the mask with the novel buried power grid design, is used to define the grid by implanting dopants (20) into the surface of the epi layer. Only one implant step using dopants of conductivity type opposite of that of the epi (e.g., n-type grid dopants into a p-type epi layer) is needed to form the buried grid (21). The dopant concentration in the grid must be greater than the dopant concentration in the epi layer so that the grid forms a nearly abrupt one-sided pn junction with the surrounding epi layer. (With this process step, the buried power grid can also be selectively masked out of areas in the epi where the presence of the grid might interfere with intended circuit elements, such as deep profiled devices like the vertically structured bipolar transistors used in bipolar-CMOS (BiCMOS) technologies. An important byproduct of the mesh design guidelines for the buried power grid is that there are no critical mask alignments with the devices to be built on the top surface now needed for the buried power grid to be completely effective in improving circuit radiation hardness. The masking layers are stripped (c.) and the surface is prepared for additional epitaxial layer growth to the final epi layer thickness (d.) (22). The objective is to have the buried grid as close as possible to the transistors to be located on the top surface of the semiconductor without having the grid in any way interfere with the electrical properties of the transistors to be formed on the epi top surface. The final buried power grid depth in the epi layer must be no deeper than the intended final depth of the well regions in the epi layer. Another photolithographic masking step (23) is now used to selectively form the shallow well (24) in the epi layer as depicted in (e.). The well dopants (in this case, n-type dopants for an n-well) are only implanted into the specifically defined well regions on the chip. To ensure that the final fully formed well regions make electrical contact with the buried grid regions to provide power to the grid, the boundary edges of the grid design adjacent to well regions (25) are designed as shown in FIG. 11 with finger extensions (δ) (26) beyond the designed well edges to account for any worst case alignment and process tolerance issues. Additionally, as stated earlier, the relationship between the targeted final shallow well depth and the depth of the buried power grid in the epi layer must be established to ensure electrical continuity on contact between the grid and the shallow well regions. Thermal processes that occur later in the IC process flow can be used to activate the grid and well dopants and to complete the well and buried power grid formation, as illustrated in (f.). A subsequent series of well-known process steps are used to form the transistors on the top semiconductor surface and then to provide interconnection layers to form the complete circuit. There are no uniquely complex process steps required for forming buried power grids. Epitaxial growth, photolithographic masking, and ion implantation are well understood, highly-controlled processes that represent some of the key process steps widely used in advanced CMOS process technologies. (High-temperature diffusion might be substituted for ion implantation). The final physical cross-section of a CMOS inverter now with buried power grid (27) selectively placed in the epi layer (28) is illustrated in FIG. 12. Now enhanced protection against logic upsets is provided to even the circuit elements built outside of the shallow well, as will be described in the following discussion.

An importantly unique feature of the buried power grid concept is that the power to the grid is applied through an inherent, pre-existing feature of CMOS, the wells. No surface contact regions with deep plugs are required to apply power to the grid. In our example, the n-type buried grid that is formed within a p-type epi layer is powered to VDD by ensuring that the VDD-biased n-type wells that are formed in the grounded epi layer come into physical contact with the underlying n-type buried grid. Most importantly a reverse-biased pn junction forms all along the grid/epi interface. As stated earlier, a powered reverse-biased pn junction is a very efficient collector of excess charge, so the buried power grid now provides an enhanced level of protection to the transistors built on the epi surface thereby significantly improving the radiation tolerance of the overall CMOS circuit. Unpowered buried layers would be far less effective. As an additional benefit, the buried power grid significantly decreases the latchup susceptibility for CMOS by shortening the length (and thus reducing the effective resistance) along the path of potential triggering currents flowing between the epi layer and the wells.

Figure 13:
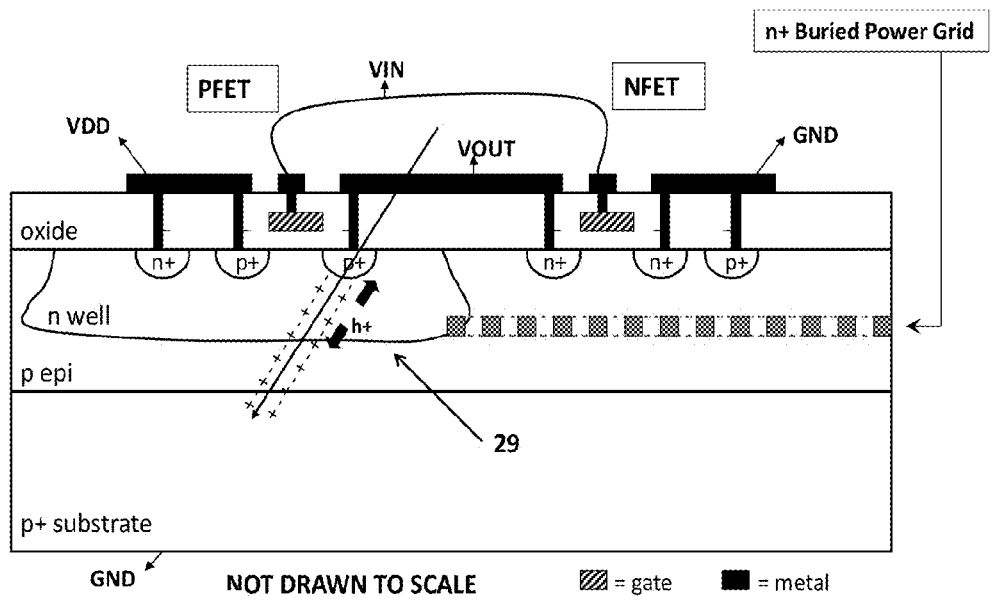
Figure 14:
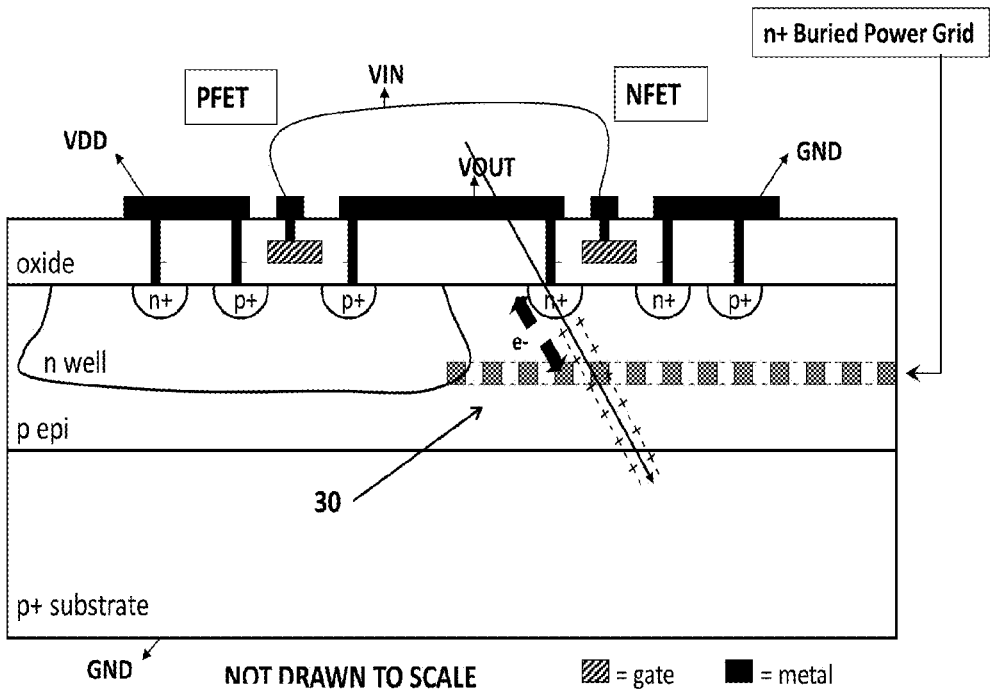
FIG. 14. Illustration of ion strike outside of well for CMOS with buried power grid.

Buried power grids improve the radiation hardness of CMOS circuits by significantly reducing the amount of radiation induced excess charge collected by sensitive circuit nodes. Where the well-epi reverse-biased junction provides enhanced protection against upsets to ion strikes within the well (29), as described earlier (FIG. 13), now with the buried power grid, for ion strikes to sensitive regions outside of the well, the reverse-biased n buried power grid/p-epi junction not only truncates the ion track at a shorter track length than the p epi/p+ substrate interface would have, but also, due to the electrical field at this reverse-biased junction, draws some of the excess electrons generated near the sensitive region away from the drain region of NFET so that only a fraction of the excess electrons along the track near the drain are collected by the NFET drain (30), providing enhanced protection against logic upsets, as now illustrated in FIG. 14.

Figure 15:
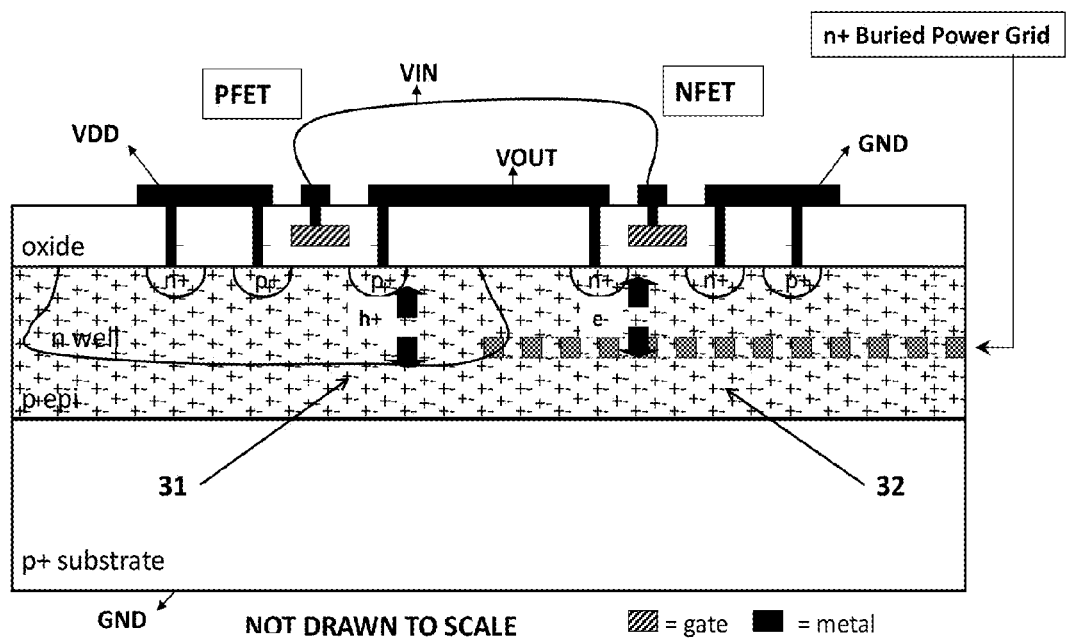
FIG. 15. Illustration of prompt dose induced excess charge collection in CMOS with buried power grid.

Again, in the event of a high ionizing dose rate pulse the well-epi reverse-biased junction provides enhanced protection against upsets for devices within the well (31). Similarly, the n buried power grid and the associated reverse-biased n-grid/p-epi junction not only restricts the collection volume for excess electrons in the sensitive region around the NFET drain but also, due to the electrical field at this reverse-biased grid/epi junction, draws some of the excess electrons generated in this sensitive region around the drain away from the drain of NFET so that only a fraction of the excess electrons within the sensitive region around the drain are collected by the NFET drain (32), providing enhanced protection against logic upsets, as illustrated in FIG. 15. These improvements in the radiation hardness of CMOS circuits provided by buried power grids are achieved independent of the design of the circuits on the top surface.

Extensions of the Buried Power Grid Concept

Figure 16:
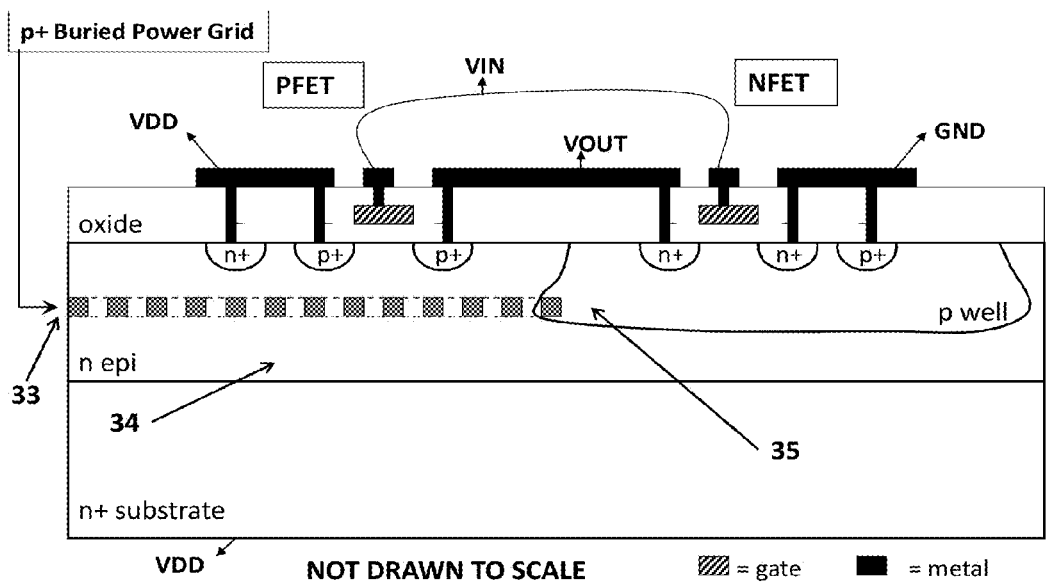
FIG. 16. Physical cross section of CMOS inverter with reverse-biased p+ buried power grid in n epi layer FIG. 17. Physical cross section of CMOS inverter with reverse-biased n+ buried power grid in p epi layer where grid was formed by an unmasked ion implantation process step, as shown here. Note: Alternate construction with a reverse-biased p+ buried power grid in n epi layer where grid formed by unmasked ion implantation process step is equivalent.

The buried power grid concept can be easily implemented into any CMOS technology with the appropriate changes in conductivity types and voltages for the regions. For example, a p-well based CMOS technology would employ a p-type buried grid (33) within the Vdd-biased n-epi substrate (34) and the buried p-grid would be biased to ground through physical contact with the grounded p-well (35), as illustrated in FIG. 16.

Figure 17:
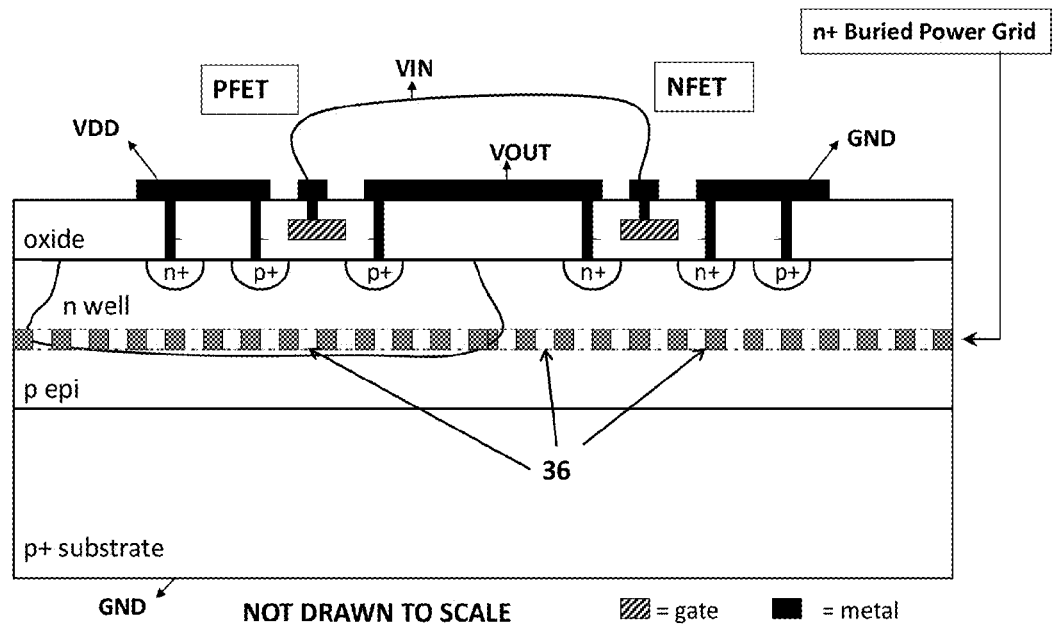

Another embodiment, as shown in FIG. 17 is constructed using an unmasked, blanketed implantation of the grid dopants, so as to form the grid over the entire chip (36), including within the well regions. This construction works equally well in some CMOS process flows assuming here that the relationship between the targeted depth of the well and the targeted depth of the grid is sufficiently offset so that the grid lies fully within the well and thus does not inadvertently extend the depth of the wells since an extended well depth would adversely affect the enhanced protection offered by the well/epi junctions to the devices that reside in the well.

Some CMOS technologies are built using a "twin tub", "dual well" approach where both n-wells and p-wells are formed into a very lightly doped or nearly intrinsic epi layer. This eliminates the requirement in single well approaches (as described to this point) that the well doping be sufficiently high enough to more than counterdope the background epi doping in which the well is formed. So with the twin tub approach the well (substrate) for each type of CMOS transistor is formed independently, enabling a higher degree of freedom in defining the well doping concentration for targeting the desired performance of the transistors built within each well.

Figure 18:
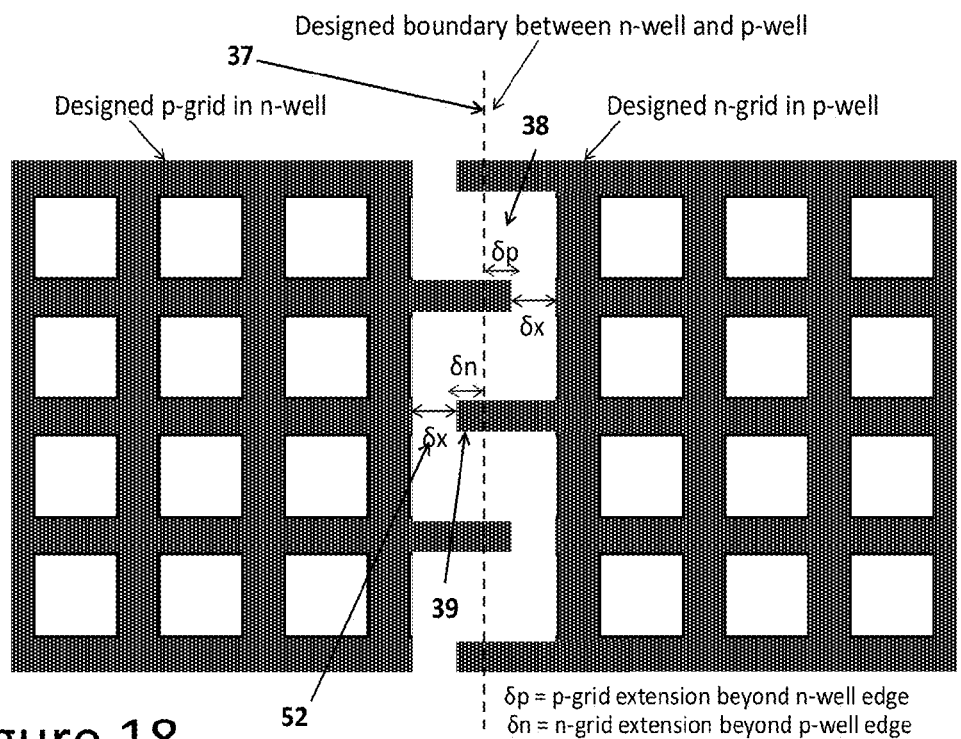
FIG. 18. Buried power grid designs at well boundary to ensure cross-sourcing power from wells to grids for dual well CMOS technologies FIG. 19. Method for forming buried power grid for twin tub technologies.

The wells formed in twin tub technologies can be typically made to be deep, limited only by the thickness of the epi layer, to accommodate deep profiled circuit elements, for example. These wells can significantly benefit from selectively placed buried power grids to improve radiation tolerance and decrease latchup susceptibility. N-type buried power grids are selectively formed in the p-wells and p-type buried power grids are selectively formed in the n-wells. See FIG. 18. At the designed boundaries between n-wells and p-wells (37), the grids must be designed to ensure electrical continuity with the neighboring well to receive power, while sustaining enough spacing between itself and adjacent grids of opposite conductivity type to prevent shorting. The grid design at the well boundaries for achieving these objectives involves interleaving the extended fingers of adjacent grids, as illustrated in FIG. 18, where δp (38) and δn (39) are the finger extensions associated with the p-grid design and the n-grid design, respectively, to account for worst case alignment and process tolerances in ensuring that the grids make electrical contact to adjacent well regions, while δx (52) is the spacing required to ensure that the p-grid and n-grid themselves do not come into electrical contact.

Figure 19:
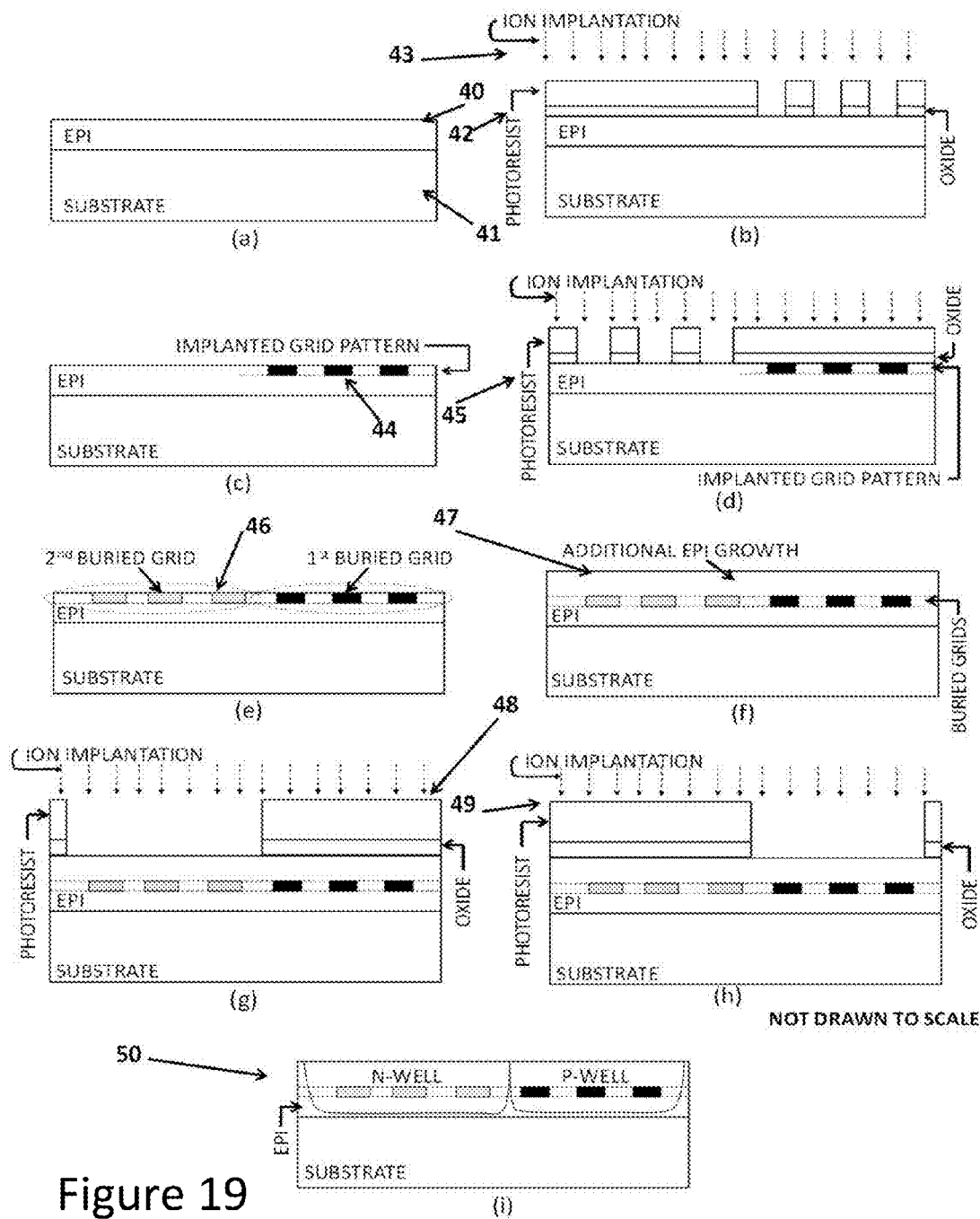
Figure 20:
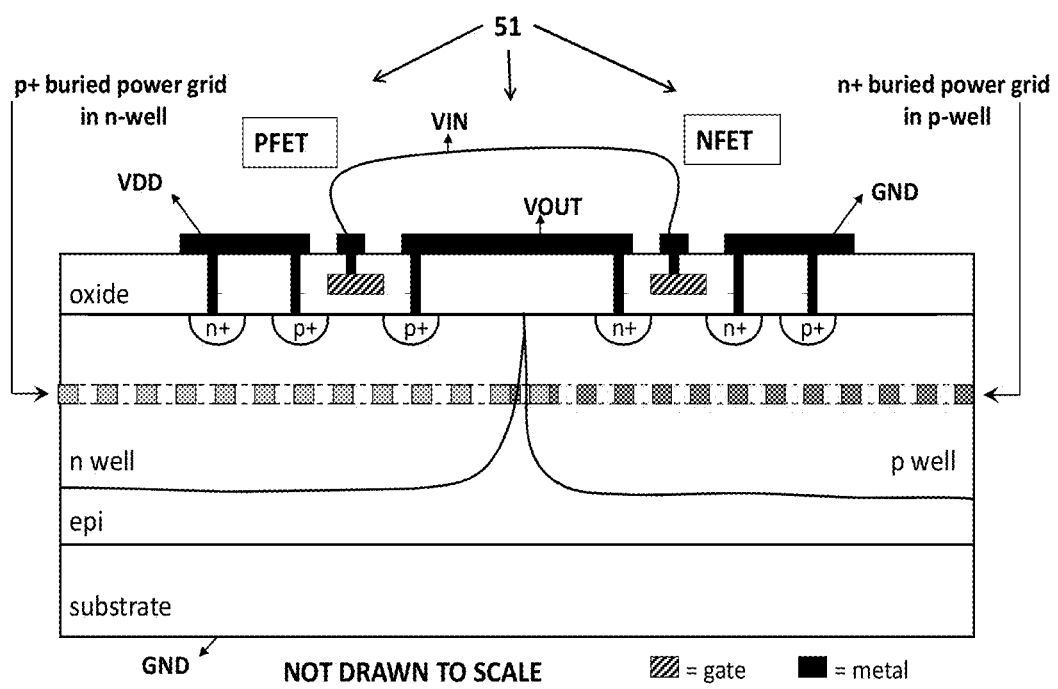
FIG. 20. CMOS cross-section with buried power grids for twin tub constructions.

Forming the buried power grids in twin tub technologies requires two distinct photolithographic masking steps; one for the p-type grid for the n-well and the other for the n-type grid for the p-well, as illustrated in the modified process flow in FIG. 19. Starting with depositing a thin, near intrinsic epitaxial layer (40) on a heavily doped substrate (41)(*a*), a photolithographic masking step (42), using the appropriate mask with the novel buried power grid design, is used to selectively implant (43)(*b*) the first buried power grid (44)(*c*) and the masking layers are stripped. A second photolithographic masking step (45)(*d*), using the other appropriate mask with the novel buried power grid design, is similarly used to form the second buried power grid (46)(*e*). The epi layer is then further grown to its final thickness (47)(*f*). Photolithographic masking steps are used to form the first well (48)(*g*) and then the second well (49)(*h*). These process steps result in forming twin tubs with each well containing a buried power grid of opposite conductivity type (i) and with each grid being powered by its electrical connection to an adjacent well of same conductivity type (50). After completing the remaining process steps for the full CMOS process, the final CMOS cross-section depicting a twin tub construction with buried power grids (51) is shown in FIG. 20. In this fashion, these buried grid design concepts are thus extendible to multiple tub technologies.

What is claimed is:

1. A semiconductor device comprising:
a heavily doped substrate semiconductor material of first conductivity type; and
an epitaxial layer of lightly doped semiconductor material of first conductivity type formed on the heavily doped substrate material having a first impurity concentration to function as the common substrate node of a plurality of first conductivity type CMOS transistors to be built on its surface and with an epitaxial layer thickness to fully contain the subsequent formation of well regions within the epitaxial layer; and
first well regions of second conductivity type formed within the epitaxial layer that have a second impurity concentration greater than the first impurity concentration of the epitaxial layer and which function as the common substrate nodes of a plurality of complementary second conductivity type CMOS transistors to be built on the surface of the first well regions and with shallow well depth that supports the integrity of each transistor and ensures full containment of the well regions within the epitaxial layer; and
a thin heavily doped buried grid layer for enhanced radiation protection of second conductivity type formed within the epitaxial region extending continuously throughout the epitaxial region at a final depth such that the depth of the deepest dimension of the buried grid layer is approximate to the final depth of the first well regions to ensure electrical contact with the first well regions.

2. The semiconductor device as recited in claim 1 wherein the thin heavily doped buried grid layer for enhanced radiation protection of second conductivity type formed within the epitaxial region is selectivity placed only within the epitaxial regions outside of the first well regions with the buried grid layer having finger extensions that ensure electrical contact to neighboring first well regions and at a final depth such that the depth of the deepest dimension of the buried grid layer is approximate to the final depth of the first well regions to ensure that the finger extensions make electrical contact with the first well regions.

3. The semiconductor device as recited in claim 1 wherein second well regions of first conductivity type are formed within the epitaxial layer of first conductivity type that have a third well impurity concentration greater than the first impurity concentration of the epitaxial layer and which function as the common substrate nodes of a plurality of complementary first conductivity type CMOS transistors to be built on the surface of the second well regions and with shallow well depth that supports the integrity of each transistor and ensures full containment of the well regions within the epitaxial layer; and
 a thin heavily doped buried grid layer for enhanced radiation protection of second conductivity type formed within the epitaxial region selectivity placed within the epitaxial regions outside of the first well regions with the buried grid layer having finger extensions that ensure electrical contact to neighboring first well regions while maintaining adequate spacing from neighboring buried grid layers of opposite (first) conductivity type, at a final depth such that the depth of the deepest dimension of the buried grid layer is approximate to the final depth of the first well regions to ensure that the finger extensions make electrical contact with the first well regions; and
 a thin heavily doped buried grid layer for enhanced radiation protection of first conductivity type formed within the epitaxial region selectivity placed within the epitaxial regions outside of the second well regions with the buried grid layer having finger extensions that ensure electrical contact to neighboring second well regions while maintaining adequate spacing from neighboring buried grid layers of opposite (second) conductivity type, at a final depth such that the depth of the deepest dimension of the buried grid layer is approximate to the final depth of the second well regions to ensure that the finger extensions make electrical contact with the second well regions.

4. A buried power grid for enhanced radiation protection design comprising:
 a heavily-doped mesh-structured diffusion region formed below the surface of the epitaxial substrate layer to place a reverse-biased, excess charge collecting pn junction beneath the surface of the CMOS device for enhance radiation protection; and
 a heavily-doped mesh-structured diffusion region with charge-neutral substrate regions bounded by the depletion regions between the powered gridlines in the grid design for maintaining the electrical continuity of the substrate on all sides of the grid and throughout the contiguous substrate preserving the electrical integrity of the substrate; and
 a heavily-doped mesh-structured diffusion region with charge-neutral substrate regions designed to be no greater than the diameter of the initial ion track plasma for a particle striking at normal incidence to the surface of the IC (i.e., 200 nm) but large enough to reliably ensure the electrical continuity of the substrate ($\geq 50$ nm) and with a gridline width designed as small as possible ($\leq 500$ nm) to further ensures better overall ground distribution within substrate.

5. The buried power grid for enhanced radiation protection design recited in claim 4 further comprising a heavily-doped mesh-structured diffusion region with charge-nutral substrate regions designed with gridline finger extensions to ensure that the final fully formed well regions make electrical contact with the buried grid regions of same conductivity type to provide power to the grid and with an adequate minimum buried grid spacing design rule if needed to ensure the electrical separation of buried grids from neighboring buried grids of opposite conductivity type.

6. The method for forming buried power grids comprising:
 (I.) form a thin epitaxial layer on a heavily doped semiconductor substrate material of the same conductivity type; and
 (II.) perform a photolithographic masking step using the mask with the (first) buried power grid design to define the grid by implanting dopants of conductivity type opposite of that of the epitaxial substrate into the surface of the epitaxial layer with a grid dopant concentration that is greater than the dopant concentration in the epitaxial layer so that the grid forms a nearly abrupt one-sided pn junction with the surrounding epi layer; and
 (III.) strip the masking layers and prepare the surface for additional epitaxial layer growth to the final epi layer thickness such that the buried grid as close as possible to the transistors to be located on the top surface of the semiconductor without having the grid in any way interfere with the electrical properties of the transistors to be formed on the epitaxial top surface and the final buried power grid depth in the epi layer must be no deeper than the intended final depth of the well regions in the epi layer; and
 (IV.) perform a photolithographic masking step to selectively form the (first) shallow well regions in the epitaxial layer by implanting dopants of conductivity type opposite of that of the epitaxial substrate into the surface of the epitaxial layer ensuring that the final fully formed (first) well regions make electrical contact with the (first) buried grid regions to provide power to the buried grid; and
 (V.) perform a subsequent series of well-known process steps to form the transistors on the top semiconductor surface and then to provide interconnection layers to form the complete circuit.

7. The method for forming buried power grids recited in claim 6 further comprising:
 (IIa.) strip masking layers and perform a photolithographic masking step to a second buried power grid of opposite conductivity type of the first buried power grid using the appropriate mask with the second buried power grid design; and
 (IVa.) strip masking layers and perform another photolithographic masking step to selectively form the second shallow well regions in the epitaxial layer by implanting dopants of conductivity type opposite of that of first well regions into the surface of the epitaxial layer ensuring that the final fully formed second well regions make electrical contact with the second buried grid regions to provide power to the buried grid.

* * * * *